United States Patent
Chen

(10) Patent No.: US 9,046,305 B2
(45) Date of Patent: Jun. 2, 2015

(54) PHASE CHANGE TYPE HEAT DISSIPATING DEVICE

(71) Applicant: Rung-An Chen, New Taipei (TW)

(72) Inventor: Rung-An Chen, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 428 days.

(21) Appl. No.: 13/631,764

(22) Filed: Sep. 28, 2012

(65) Prior Publication Data

US 2013/0327502 A1 Dec. 12, 2013

(30) Foreign Application Priority Data

Jun. 8, 2012 (TW) .................................. 101120756

(51) Int. Cl.
| | | |
|---|---|---|
| H01L 23/427 | (2006.01) | |
| H05K 7/20 | (2006.01) | |
| F28D 15/02 | (2006.01) | |
| F28D 20/02 | (2006.01) | |

(52) U.S. Cl.
CPC ............ *F28D 15/02* (2013.01); *H01L 23/4275* (2013.01); *F28D 15/0233* (2013.01); *F28D 15/0275* (2013.01); *F28D 20/02* (2013.01); *H01L 23/427* (2013.01); *H01L 2924/0002* (2013.01); *Y02E 60/145* (2013.01)

(58) Field of Classification Search
CPC . F28D 15/02; F28D 15/0233; F28D 15/0275; F28D 20/02; H01L 23/427; H01L 23/4275; H01L 2924/0002; H01L 2924/00
See application file for complete search history.

(56) References Cited

U.S. PATENT DOCUMENTS

| | | | | |
|---|---|---|---|---|
| 5,455,458 | A  * | 10/1995 | Quon et al. ................... | 257/714 |
| 5,579,830 | A  * | 12/1996 | Giammaruti ............. | 165/104.27 |
| 6,971,443 | B2 * | 12/2005 | Kung et al. .............. | 165/104.26 |
| 7,505,269 | B1 * | 3/2009 | Cosley et al. ................. | 361/700 |
| 8,934,235 | B2 * | 1/2015 | Rubenstein et al. ...... | 361/679.47 |
| 2006/0209516 | A1* | 9/2006 | Chengalva et al. ........... | 361/719 |
| 2009/0071628 | A1* | 3/2009 | Jang ......................... | 165/104.21 |
| 2009/0109623 | A1* | 4/2009 | Jang et al. .................... | 361/700 |
| 2012/0206880 | A1* | 8/2012 | Andres et al. ................ | 361/700 |
| 2013/0186598 | A1* | 7/2013 | Rubenstein .............. | 165/104.21 |
| 2013/0327501 | A1* | 12/2013 | Chen ........................ | 165/104.17 |
| 2013/0329369 | A1* | 12/2013 | Chen ............................ | 361/720 |

FOREIGN PATENT DOCUMENTS

| | | | | |
|---|---|---|---|---|
| JP | 2588633 B2 | * | 3/1997 | .............. B64G 1/50 |
| JP | 09273877 A | * | 10/1997 | .............. F28D 15/02 |
| JP | 2010-236783 | | 10/2010 | |
| JP | 2012-99612 | | 5/2012 | |
| TW | 200843630 A | | 11/2008 | |
| TW | 200917941 A | | 4/2009 | |

* cited by examiner

*Primary Examiner* — Robert J Hoffberg
(74) *Attorney, Agent, or Firm* — Novak Druce Connolly Bove + Quigg LLP

(57) ABSTRACT

A phase change type heat dissipating device for dissipating heat from a heat generating component includes a casing, a working medium received in the casing and a heat pipe connected to the casing. The heat pipe includes an evaporator section and a condenser section. The working medium is electrically insulated and phase change material, and represents solid state at normal temperature. The heat generating component is received in the casing, and the evaporator section of the heat pipe extends into the casing and contacts the working medium.

6 Claims, 2 Drawing Sheets

PHASE CHANGE TYPE HEAT DISSIPATING DEVICE

BACKGROUND

1. Technical Field

The present disclosure generally relates to a dissipating device, and more particularly to a dissipating device for removing heat from an electronic component by phase changing.

2. Description of the Related Art

As electronic technology continues to advance, electronic components are made to provide faster operational speeds and greater functional capabilities. When an electronic component operates at a high speed for a long time, its temperature usually increases greatly. It is therefore desirable to provide a heat dissipating device for removing the generated heat quickly.

A traditional dissipating device is a metal radiator on a top of the electronic component of an electronic device. The radiator is arranged in a casing of the electronic device. The radiator includes a base contacting with the electronic component and a plurality of fins attached to the base. Heat generated by the electronic component is conducted into the base and dissipated to ambient air from the fins.

With respect to some electronic devices working intermittently, the time of operation under high loading is relative short than the time of standby or the time of operation under low loading. When the electronic device works under high loading, the heat generated by the electronic component is conducted to the air inside a case of the electronic device quickly via the fins. This leads to a high increasing of the temperature of the case of the electronic device in a short time, and a negative affect of operation for the user. When the electronic device is standby or works under low loading, the heat generated by the electronic component is less, and the fins can not be used efficiently.

Therefore, it is desirable to provide a dissipating device can overcome the above problem.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present dissipating device. Moreover, in the drawings, like reference numerals designate corresponding parts throughout the views.

DETAILED DESCRIPTION

Figure 1:
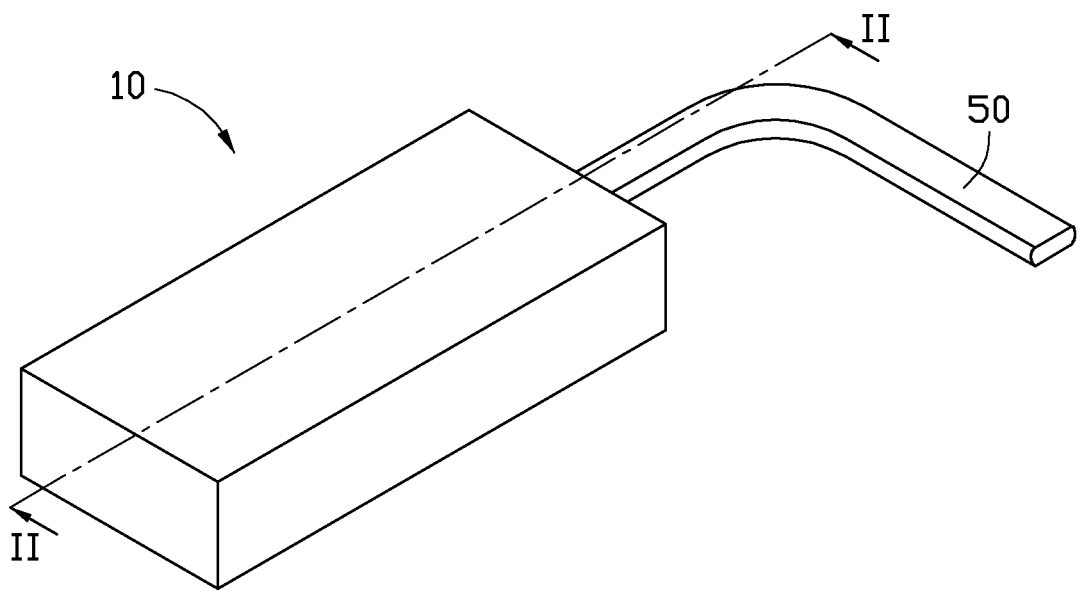
FIG. 1 is an assembled, isometric view of a phase change type heat dissipating device in accordance with an embodiment of the disclosure.
Figure 2:
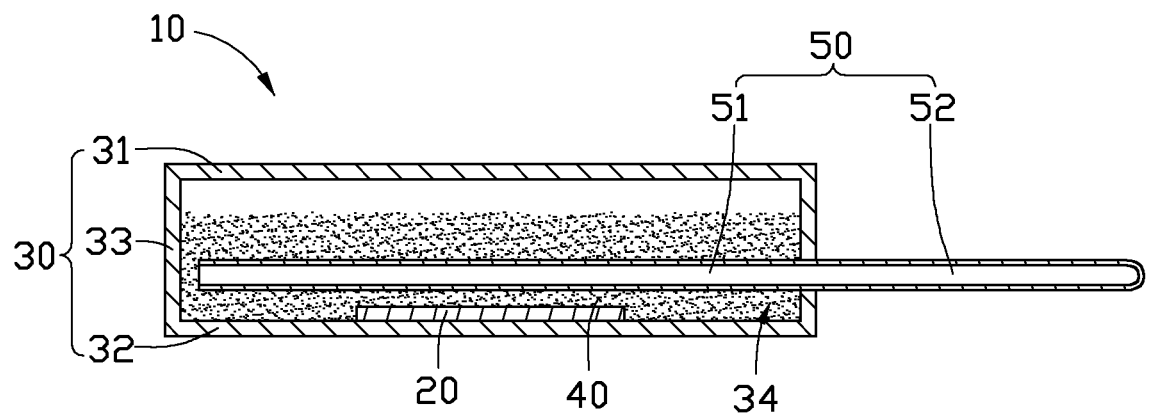
FIG. 2 is a cross sectional view of the phase change type heat dissipating device of FIG. 1, taken along line II-II thereof.

Referring to FIG. 1 to FIG. 2, a phase change type heat dissipating device 10 in accordance with an exemplary embodiment is provided for removing heat from a heat generating component 20 of an electronic device (not shown). The phase change type heat dissipating device 10 includes a casing 30, a working medium 40 received in the casing 30 and a heat pipe 50 connected to the casing 30.

Specifically, the casing 30 includes a top cover 31, a bottom plate 32 opposite to the top cover 31 and a plurality of sidewalls 33 connecting the top cover 31 and the bottom plate 32. The top cover 31 and the bottom plate 32 are flat and the size of the top cover 31 is equal to that of the bottom plate 32. The sidewalls 33 extend upward from a periphery of the bottom plate 32 as a single piece. A periphery of a bottom surface of the top cover 31 is attached to top ends of the sidewalls 33, whereby a cavity 34 is formed between the top cover 31 and the bottom plate 32. The top cover 31, the bottom plate 32 and the sidewalls 33 are made from materials having good heat conductivity, such as aluminum and copper. Alternatively, the top cover 31 and the bottom plate 32 can be a shell of other component disposed in the electronic device.

The working medium 40 is received in the cavity 34. The working medium 40 is electrically insulated and phase change material, and represents solid state at normal temperature. A volume of the working medium 40 under the normal temperature is smaller than a volume of the cavity 34. The working medium 40 can be liquefied to liquid at a certain temperature. A melting point of the working medium 40 is between a temperature of the heat generating component 20 under standby/low-loading and the temperature of the heat generating component 20 under high-loading. The working medium 40 can be hydrate, organic acid or esters etc.

The heat pipe 50 connects the casing 30 by extending through the sidewall 33. The heat pipe 50 is flat and includes an evaporator section 51 and a condenser section 52. The condenser section 52 is attached to a heat sink (not shown) disposed out of the casing 30. The evaporator section 51 is located in the cavity 34 and is spaced from the heat generating component 20. The heat pipe 50 contacts the working medium 40 for conducting heat in the cavity 34 to the heat sink.

When assembled, the heat generating component 20 electrically connected to other components in the electronic device by being mounted on a printed circuit board, such as surface mounted technology (SMT). The cavity 34 encloses the heat generating component 20. In this embodiment, the heat generating component 20 is disposed on the bottom plate 32, the working medium 40 covers the heat generating component 20 and directly contacts the heat generating component 20. The evaporator section 51 of the heat pipe 50 inserts in the working medium 40 and is spaced from the heat generating component 20.

When the heat generating component 20 works under high-loading, heat generated by the heat generating component 20 is conducted to the working medium 40 quickly. The working medium 40 close to the heat generated component 20 is heated and liquefied to liquid firstly, then thermal convection is generated to prompt the working medium 40 relatively far from the heat generating component 20 and close to the inner surface of the cavity 34 being heated and liquefied. After that, when all of the working medium 40 is liquefied to liquid, heat is conducted to the inner surface of the cavity 34 and the heat pipe 50. During the process of liquefaction, most heat can be temporarily stored in the working medium 40 and a little heat is conducted to the external shell (not shown) of the electronic device. Consequently, the surface of the heat generating component 20 is kept in a relative low temperature, and the temperature of the shell is avoided rising too fast in a short time; thus, the operation of the electronic device by the user is not affected.

When the heat generating component 20 is under a standby or works under low-loading, since the heat generating capacity of the heat generating component 20 is smaller than the heat dissipation capacity of the working medium 40 and the shell, the working medium 40 keeps conducting heat and exchanging heat to external air via the heat pipe 50. In the above process of operation under high-loading and standby/under low-loading, the working medium 40 is used for absorbing, conducting and exchanging heat. As a dissipation medium, the working medium 40 can be utilized fully. Due to the electrical insulation characteristic of the working medium 40, the working medium 40 will not affect the working performance of the heat generating component 20.

The shape of the top cover 31, and the bottom plate 32 are not limited to flat, and can be other shape, such as triangular pyramid. The shape of the working medium 40 can be designed according to the shape of the cavity 34 for being received in the cavity 34.

In summary, the heat generating component 20 and the working medium 40 are received in the casing 30 of the phase change type heat dissipating device 10. The evaporator section 51 of the heat pipe 50 extends into the casing 30 and contacts the working medium 40. The working medium 40 represents solid state at normal temperature. The working medium 40 is in contact with the heat generating component 20. When the heat generating component 20 works under high-loading, heat generated by the heat generating component 20 is conducted to the working medium 40 firstly, the working medium 40 is liquefied gradually for temporarily storing heat. Thus, heat is conducted to the external shell of the electronic device slowly, and the temperature of the external shell is avoided rising too fast in a short time for facilitating the operation of the user. When the phase change type heat dissipating device 10 is under a standby or works under low-loading, the working medium 40 keeps conducting heat and exchanging heat to external air via the heat pipe 50. The working medium 40 turns to be solid state gradually for preparing to store heat in temporary in a next high loading status.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A phase change type heat dissipating device for removing heat from a heat generating component, the phase change type heat dissipating device comprising:
   a casing enclosing the heat generating component, the casing comprises a top cover and a bottom plate opposite to the top cover, a plurality of sidewalls extend upward from a periphery of the bottom plate, and a periphery of a bottom surface of the top cover is attached to top ends of the sidewalls to form a cavity, the heat generating component is located at the bottom plate;
   a working medium received in the casing, the working medium being disposed between the top cover and the bottom plate, the working medium covers the heat generating component, the working medium being electrically insulated and a phase change material, and representing solid state of the phase change material at a temperature of the heat generating component under standby/low-loading; and
   a heat pipe connected to the casing, the heat pipe comprising an evaporator section inserting in the casing and contacting the working medium, and a condenser section extending out of the casing.

2. The phase change type heat dissipating device of claim 1, wherein the working medium is made from hydrate, organic acid or esters.

3. The phase change type heat dissipating device of claim 1, wherein the heat generating component electrically connects to external power source via printed circuit board or wire out of the casing.

4. The phase change type heat dissipating device of claim 1, wherein the top cover and the bottom plate are made from copper or aluminum.

5. The phase change type heat dissipating device of claim 1, wherein the evaporator section of the heat pipe is spaced from the heat generating component.

6. The phase change type heat dissipating device of claim 1, wherein a melting point of the working medium is between the temperature of the heat generating component under standby/low-loading and the temperature of the heat generating component under high loading.

* * * * *